United States Patent
Templier et al.

(10) Patent No.: US 11,127,884 B2
(45) Date of Patent: Sep. 21, 2021

(54) OPTOELECTRONIC DEVICE WITH LIGHT-EMITTING DIODE WITH EXTRACTION ENHANCEMENT

(71) Applicant: Commissariat à l'Énergie Atomique et aux Énergies Alternatives, Paris (FR)

(72) Inventors: François Templier, Grenoble (FR); Salim Boutami, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/465,711

(22) PCT Filed: Nov. 30, 2017

(86) PCT No.: PCT/FR2017/053327
§ 371 (c)(1),
(2) Date: May 31, 2019

(87) PCT Pub. No.: WO2018/100316
PCT Pub. Date: Jun. 7, 2018

(65) Prior Publication Data
US 2019/0296191 A1    Sep. 26, 2019

(30) Foreign Application Priority Data
Dec. 2, 2016  (FR) ...................................... 1661879

(51) Int. Cl.
*H01L 33/22*     (2010.01)
*H01L 33/00*     (2010.01)
*H01L 33/20*     (2010.01)

(52) U.S. Cl.
CPC ............ *H01L 33/22* (2013.01); *H01L 33/005* (2013.01); *H01L 33/20* (2013.01); *H01L 2933/0083* (2013.01); *H01L 2933/0091* (2013.01)

(58) Field of Classification Search
CPC ......... H01L 33/0004–648; H01L 33/22; H01L 33/20; H01L 33/005; H01L 2933/0083; H01L 2933/0091
See application file for complete search history.

(56) References Cited

U.S. PATENT DOCUMENTS

2004/0206969 A1   10/2004 Orita
2006/0192217 A1   8/2006 David et al.
(Continued)

FOREIGN PATENT DOCUMENTS

EP    1 624 499 A2    2/2006
EP    1 995 794 A1    11/2008
(Continued)

OTHER PUBLICATIONS

International Search Report and Written Opinion for International Application No. PCT/FR2017/053327, dated Feb. 22, 2018.
(Continued)

*Primary Examiner* — Cuong B Nguyen
(74) *Attorney, Agent, or Firm* — Wolf, Greenfield & Sacks, P.C.

(57) ABSTRACT

An optoelectronic device including an active area capable of supplying an electromagnetic radiation and sandwiched between first and second semiconductor layers, the first semiconductor layer delimiting a surface, the optoelectronic device further including a diffraction grating capable of extracting the electromagnetic radiation from the first semiconductor layer, the diffraction grating including holes extending in the first semiconductor layer from said surface,
(Continued)

the width of the holes measured in a plane parallel to said surface increasing from a central portion of the diffraction grating to a peripheral portion of the diffraction grating.

8 Claims, 7 Drawing Sheets

(56) References Cited

U.S. PATENT DOCUMENTS

| | | |
|---|---|---|
| 2007/0262330 A1 | 11/2007 | Lee et al. |
| 2008/0258160 A1 | 10/2008 | Do |
| 2009/0050905 A1* | 2/2009 | Abu-Ageel ............. H01L 33/20 |
| | | 257/80 |
| 2010/0072501 A1* | 3/2010 | Wakai ................... H01L 33/007 |
| | | 257/98 |
| 2012/0012874 A1 | 1/2012 | Morioka et al. |
| 2015/0117015 A1 | 4/2015 | Roh et al. |
| 2015/0228931 A1 | 8/2015 | Lamansky et al. |

FOREIGN PATENT DOCUMENTS

| | | |
|---|---|---|
| EP | 2 355 182 A2 | 8/2011 |
| EP | 2 752 895 A1 | 7/2014 |
| WO | WO 2008/079079 A1 | 7/2008 |

OTHER PUBLICATIONS

Preliminary Search Report for French Application No. 1661879, dated Aug. 22, 2017.
International Preliminary Report on Patentability for International Application No. PCT/FR2017/053327, dated Jun. 13, 2019.

* cited by examiner

OPTOELECTRONIC DEVICE WITH LIGHT-EMITTING DIODE WITH EXTRACTION ENHANCEMENT

This application is a national stage filing under 35 U.S.C. 371 of International Patent Application Serial No. PCT/FR2017/053327, filed Nov. 30, 2017, which claims priority to French patent application FR16/61879, filed Dec. 2, 2016. The entire contents of these applications are incorporated herein by reference in their entireties.

BACKGROUND

The present invention generally concerns optoelectronic devices made up of semiconductor materials and methods of manufacturing the same. The present invention more specifically relates to optoelectronic devices comprising light-emitting diodes.

DISCUSSION OF THE RELATED ART

Phrase "optoelectronic devices comprising light-emitting diodes" designates devices capable of converting an electric signal into an electromagnetic radiation, and particularly devices dedicated to emitting an electromagnetic radiation, particularly light.

Generally, the optoelectronic device comprises at least one light-emitting diode formed by a stack of semiconductor layers. The active area is the area of the light-emitting diode from which most of the radiation delivered by the light-emitting diode is emitted. The active area may comprise confinement means. As an example, the active area may comprise a single quantum well or multiple quantum wells.

The extraction efficiency of an optoelectronic device is generally defined by the ratio of the number of photons escaping from the optoelectronic device to the number of photons emitted by the active area of the device. It is desirable for the extraction efficiency of an optoelectronic device to be as high as possible. However, part of the radiation may remain trapped in the optoelectronic device.

FIG. 1 is a partial simplified cross-section view of an embodiment of an optoelectronic device 10 comprising a light-emitting diode. As an example, optoelectronic device 10 may have a structure with a symmetry of revolution. Optoelectronic device 10 comprises a stack 12 of semiconductor layers, for example, mainly comprising an alloy of a group-III element and of a group-V element, for example, GaN. The stack may comprise a doped semiconductor layer 14 of a first conductivity type, for example, P-type doped, a doped semiconductor layer 16 of a second conductivity type opposite to the first type, for example, N-type doped, and an active area 18 sandwiched between semiconductor layers 14 and 16. Semiconductor layer 16 comprises a surface 20, called emission surface or front surface, having the electromagnetic radiation emitted by active area 18 escaping therefrom. Call Z the direction perpendicular to surface 20.

Optoelectronic device 10 further comprises an electrically-conductive pad 22 in contact with semiconductor layer 14. Electronic device 10 further comprises an electrically-conductive pad, not shown, coupled to semiconductor layer 16. Optoelectronic device 10 further comprises an electrically-insulating portion 26 laterally delimiting semiconductor layer 14 and active area 18. The conductive pads enable to power active area 18 for the emission of an electromagnetic radiation.

Part of the electromagnetic radiation directly escapes through emission surface 20 without for the electromagnetic waves to reflect on the walls of optoelectronic device 10. This propagation mode of the electromagnetic radiation is called direct radiation mode and is schematically shown in FIG. 1 by wavefronts 27. The directivity of optoelectronic device 10 corresponds to the proportion of the radiation which escapes through emission surface 20 along the same direction. The larger this proportion, the more directional the optoelectronic device. The light rays of the direct radiation mode are substantially orthogonal to emission surface 20 so that optoelectronic device 10 is directional when only the direct radiation mode is present. However, the beam which escapes from optoelectronic device 10 due to the direct radiation mode is generally diverging. FIG. 1 shows the half angle of divergence θ, of the beam emitted by optoelectronic device 10.

Part of the electromagnetic radiation reflects on the walls of optoelectronic device 10 along different paths. Such propagation modes are called guided modes. Guided modes are schematically shown in FIG. 1 by rays 28 which reflect on walls of optoelectronic device 10. At least part of the electromagnetic radiation which propagates according to guided modes may remain trapped in optoelectronic device 10.

It is known to form a periodic diffraction grating on front surface 20 to increase the extraction efficiency of optoelectronic device 10. A periodic diffraction grating for example comprises rectilinear or circular grooves formed in front surface 20. Such a grating has at least one symmetry, for example, an axial symmetry, a symmetry with respect to a plane, or a symmetry of revolution around an axis, and comprises, in a plane containing the axis of symmetry or in the plane of symmetry, a periodically-repeated pattern (hollow portions and/or raised portions). The diffraction grating enables to at least partly extract the radiation propagating through semiconductor layer 16 according to guided modes.

However, a disadvantage of the periodic diffraction grating is that it alters the directivity of optoelectronic device 10. Indeed, the direction in which the radiation is transmitted by the periodic diffraction grating depends on the guided mode. The thickness of semiconductor layer 16 may be greater than a few micrometers so that optoelectronic device 10 generally has many guided modes which are extracted by the periodic diffraction grating according to different transmission directions.

SUMMARY

An object of an embodiment is to overcome all or part of the disadvantages of the previously-described optoelectronic devices, particularly optoelectronic devices comprising periodic diffraction gratings.

Another object of an embodiment is to increase the extraction efficiency of the optoelectronic device.

Another object of an embodiment is to increase the directivity of the electromagnetic radiation emitted by the optoelectronic device.

Another object of an embodiment is to decrease the divergence of the beam emitted by the optoelectronic device.

Thus, an embodiment provides an optoelectronic device comprising an active area capable of supplying an electromagnetic radiation and sandwiched between first and second semiconductor layers, the first semiconductor layer delimiting a surface, the optoelectronic device further comprising a diffraction grating capable of extracting the electromagnetic radiation from the first semiconductor layer, the diffraction grating comprising holes extending in the first semiconductor layer from said surface, the width of the holes measured in a plane parallel to said surface increasing from a central portion of the diffraction grating to a peripheral portion of the diffraction grating.

According to an embodiment, the diffraction grating comprises annular grooves.

According to an embodiment, the annular grooves are concentric.

According to an embodiment, the holes are arranged in rows and in columns.

According to an embodiment, the holes have a circular, ellipsoidal, or polygonal cross-section.

According to an embodiment, the thickness of the first semiconductor layer is in the range from 1 µm to 10 µm.

According to an embodiment, the depth of the holes is in the range from 30 nm to 3 µm.

According to an embodiment, the first and second semiconductor layers are at least partly formed from at least one semiconductor material selected from the group comprising III-V compounds, II-VI compounds, or group-IV semiconductors or compounds.

According to an embodiment, the distance between the central points of two adjacent holes along a radial direction of the diffraction grating is shorter than half the wavelength of the electromagnetic radiation.

An embodiment also provides a method of manufacturing an optoelectronic comprising an active area capable of supplying an electromagnetic radiation sandwiched between first and second semiconductor layers, the first semiconductor layer delimiting a surface, the method comprising forming a diffraction grating capable of extracting the electromagnetic radiation from the first semiconductor layer, the diffraction grating comprising holes extending in the first semiconductor layer from said surface, the width of the holes measured in a plane parallel to said surface increasing from a central portion of the diffraction grating to a peripheral portion of the diffraction grating.

According to an embodiment, the method comprises a step of determining depth h of the holes and of determining, for each hole, a filling factor f equal to the ratio of the width, measured radially from a center of the diffraction grating, of said hole to the distance, measured radially, between the central points of two adjacent holes along a radial direction of the diffraction grating, filling factor f and height h being determined according to the following relations:

$$\tilde{n}(r) = \tilde{n}(0) - n_i \frac{\left|\sqrt{(F-h)^2 + r^2} - (F-h)\right|}{h}$$

$$\tilde{n}(r) = \sqrt{f(r)n_e^2 + (1 - f(r))n_i^2}$$

$$F = \frac{R\cos((n_e/n_i)\sin\theta_e)}{(n_e/n_i)\sin\theta_e}$$

where r is the distance between the central point of the hole and the center, R is the radius, measured from the center, of the circumscribed circle of the diffraction grating, $n_i$ is the refraction index of the first semiconductor layer at the wavelength of the electromagnetic radiation, $n_e$ is the refraction index of the medium in contact with the first semiconductor layer at the wavelength of the electromagnetic radiation, $\theta_e$ is the half angle of divergence of the beam emitted by the optoelectronic device in the absence of the diffraction grating, and ñ(r) is the average refraction index at distance r which enables, in the absence of the diffraction grating, to obtain the same deviation of a ray extracted out of the first semiconductor layer as that obtained in the presence of the diffraction grating.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
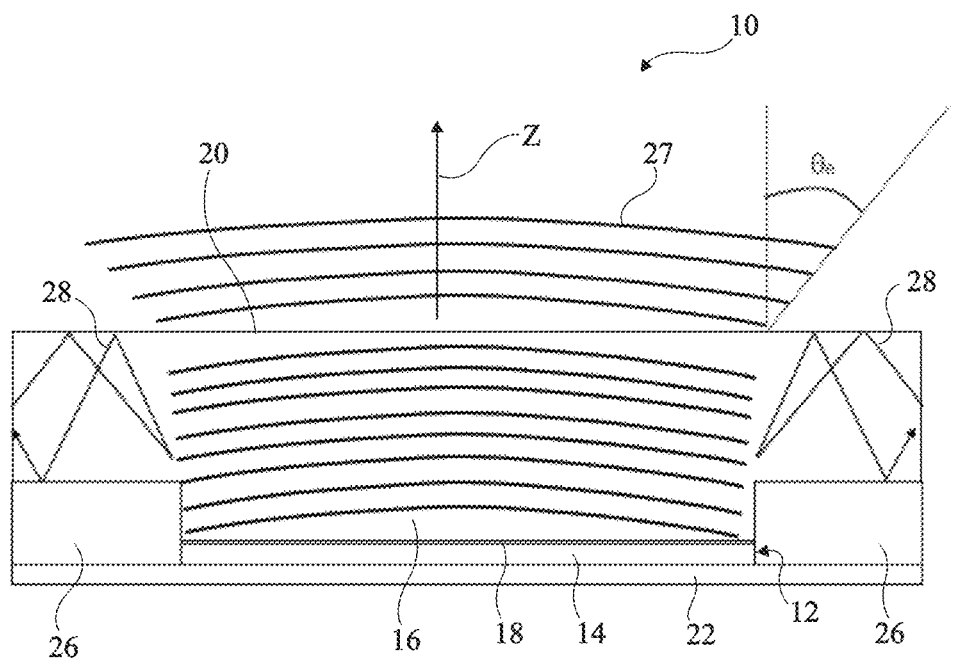
FIG. 1, previously described, is a partial simplified cross-section view of an example of an optoelectronic device comprising a light-emitting diode.

The same elements have been designated with the same reference numerals in the different drawings. For clarity, only those steps and elements which are useful to the understanding of the described embodiments have been shown and are detailed. In particular, the structure of the active area of a light-emitting diode is well known by those skilled in the art and is not described in detail hereafter. The terms "approximately", "substantially", and "in the order of" are used herein to designate a tolerance of plus or minus 10%, preferably of plus or minus 5%, of the value in question.

Figure 2:
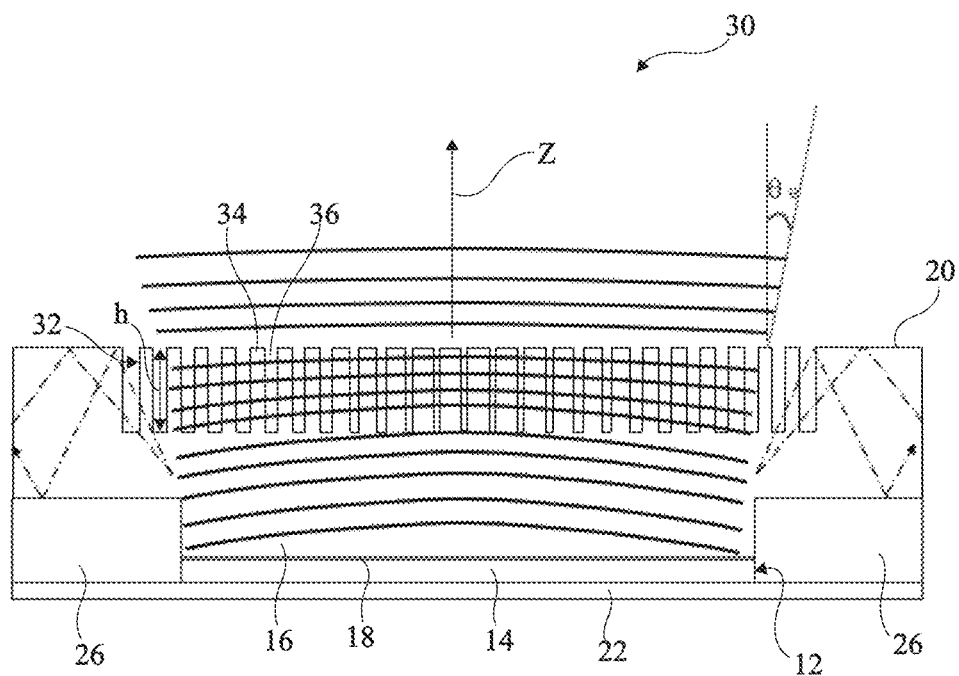
FIG. 2 is a partial simplified cross-section view of an embodiment of an optoelectronic device comprising a light-emitting diode.

FIG. 2 is a partial simplified cross-section view of an embodiment of an optoelectronic device 30 comprising a light-emitting diode.

Optoelectronic device 30 comprises all the elements of the optoelectronic 10 shown in FIG. 1, with the difference that it further comprises a diffraction grating 32 formed in semiconductor layer 16 from front surface 20. Diffraction grating 32 comprises non-through openings 36, or blind holes, which extend in semiconductor layer 16 from surface 20 across a portion of semiconductor layer 16. Holes 36 delimit portions 34 of semiconductor layer 16 raised with respect to the bottoms of holes 36.

In the present embodiment, front surface 20 is in contact with air. As a variation, optoelectronic device 30 may comprise at least one additional layer which covers semiconductor layer 16 and which is substantially transparent to the wavelength of the electromagnetic radiation emitted by active area 18. In this case, the additional layer particularly penetrates into holes 36.

According to an embodiment, diffraction grating 32 has no periodic structure. This means that there is no cross-section plane in which diffraction grating 32 exhibits a pattern which is periodically repeated. According to an embodiment, the lateral dimension or width of raised portions 34 and/or the lateral dimension or width of holes 36, measured in a plane perpendicular to direction Z, exhibits a gradient. According to an embodiment, the size of holes 36 increases from a central region of diffraction grating 32 to the periphery of diffraction grating 32. According to an embodiment, the increase in the size of holes 36 from a central region of the diffraction grating 32 to the periphery of diffraction grating 32 is continuous. According to an embodiment, the size of raised portions 34 decreases from a central region of diffraction grating 32 to the periphery of diffraction grating 32. The width of raised portions 34 and/or the width of holes 36, measured in a plane perpendicular to direction Z, is at a nanometer-range scale, that is, in the range from 20 nm to 200 nm. Preferably, holes 36 all substantially have the same depth h.

The aperiodic structure of diffraction grating 32 advantageously enables to decrease the divergence of the beam emitted by optoelectronic device 30. Indeed, for the electromagnetic radiation emitted by active area 18 and propagating according to the direct radiation mode, everything substantially occurs as if diffraction grating 32 was replaced with a surface layer present at the surface of semiconductor layer 16 and having its refraction index at the wavelength of the electromagnetic radiation emitted by active area 18 exhibiting a gradient in a plane perpendicular to direction Z, the local refraction index decreasing from the center of diffraction grating 32 to the periphery of diffraction grating 32. The gradient of the local refraction index of the surface layer seen by the electromagnetic radiation causes a better collimation of the beam emitted by optoelectronic 30, that is, a decrease in the half angle of divergence $\theta_e$ of the beam emitted by optoelectronic 30.

Further, the nanometer-range structuring of diffraction grating 32 causes a decrease in the local refraction index at the level of front surface 20 with respect to the index of the rest of semiconductor layer 16. This causes a decrease in the reflection at the interface between semiconductor layer 16 and the adjacent air layer, and thus a decrease in the excitation of the guided modes. The extraction efficiency of optoelectronic device 30 is thus increased. Further, since the proportion of the electromagnetic radiation propagating in semiconductor layer 16 according to guided modes decreases, the proportion of the guided modes which are extracted by diffraction grating 32 decreases. The directivity of optoelectronic device 30 is thus increased.

According to an embodiment, the lateral dimensions of active area 18 are smaller than the lateral dimensions of diffraction grating 32. This enables to efficiently extract the light emitted by active area 18.

Figure 3:
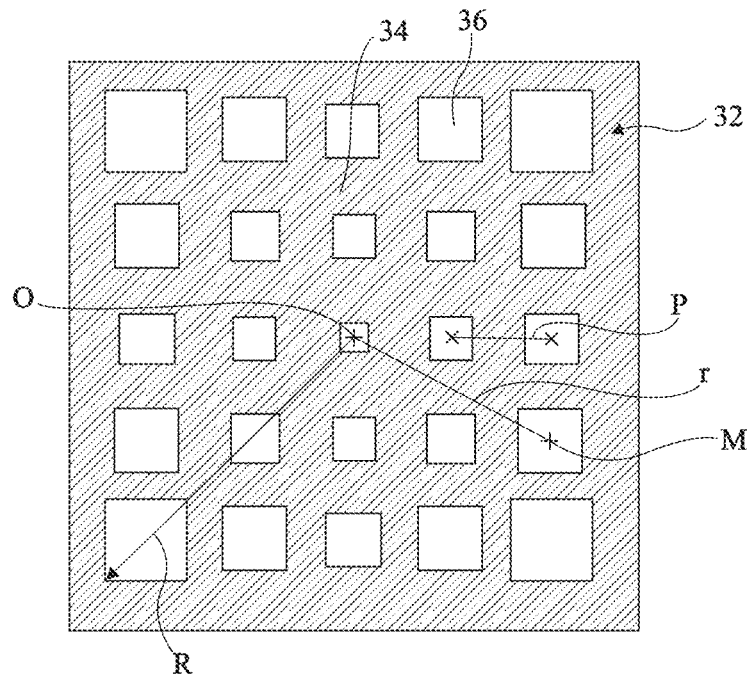
FIGS. 3 and 4 are partial simplified top views of embodiments of a diffraction grating of the optoelectronic device of FIG. 2.

FIG. 3 is a partial simplified top view of an embodiment of diffraction grating 32 where openings 36 correspond to holes having a circular, ellipsoidal, or polygonal cross-section, for example, square as shown in FIG. 3. According to an embodiment, holes 36 are arranged in rows and in columns. Although diffraction grating 32 has a certain regularity, it is however aperiodic since the dimensions of holes 36 are not constant. The cross-section of the holes increases as the distance from center O of diffraction grating 32 increases.

Figure 4:
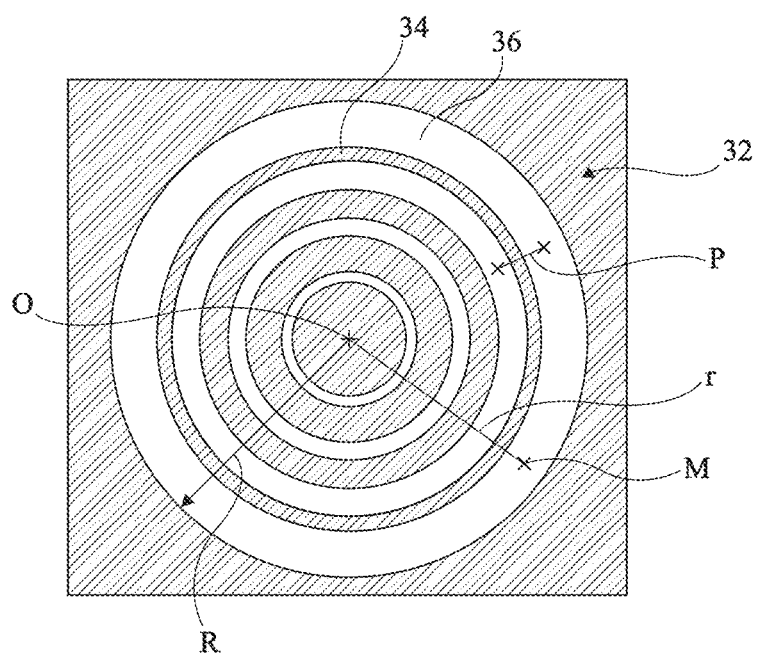

FIG. 4 is a partial simplified top view of another embodiment of diffraction grating 32 where holes 36 correspond to circular concentric grooves. In the present embodiment, diffraction grating 32 has a symmetry of revolution. According to an embodiment, the width of grooves 36 increase as the distance to center O of diffraction grating 32 increases.

A point M of diffraction grating 32 is located by the radius r, measured in a plane perpendicular to direction Z, between points M and center O of diffraction grating 32.

Diffraction grating 32 may be characterized by different relations, which will be detailed hereafter. For this purpose, the following notations are used:

h is the depth, also called height, of holes 36;

$n_i$ is the refraction index of the medium forming semiconductor layer 16 at the wavelength of the electromagnetic radiation supplied by active area 18;

$n_e$ is the refraction index of the medium adjacent to semiconductor layer 16 at the wavelength of the electromagnetic radiation supplied by active layer 18, for example, the index of air in the present embodiment;

P is the pseudo-period of diffraction grating 32, and corresponds to the distance between "central points" of adjacent holes 36 measured in a plane perpendicular to direction Z along a radial direction. In the embodiment shown in FIG. 3, pseudo-period P corresponds to the distance, measured in a plane perpendicular to direction Z, between the centers of adjacent holes 36 and aligned with center O. In the embodiment shown in FIG. 4, pseudo-period P corresponds to the distance, measured in a plane perpendicular to direction Z along a radial direction, between the skeleton lines of two adjacent grooves 36, the skeleton line of a groove being the curve corresponding to the geometric location of the points located at an equal distance, radially measured, from the groove edge;

R is the maximum radius of the circle having diffraction grating 32 inscribed therein in top view;

f(r) is the local filling factor of diffraction grating 32 defined at point M as the ratio of the width, radially measured, of the hole 36 closest to point M, over pseudo-period P; and ñ(r) is the average refraction index at point M at the wavelength of the electromagnetic radiation emitted by active area 18, that is, the refraction index that semiconductor layer 16 should have across thickness h to obtain, in the absence of diffraction grating 32, the same deviation of a ray extracted out of semiconductor layer 16 as that obtained in the presence of the diffraction grating.

Pseudo-period P reflects the fact that diffraction grating 32 exhibits some regularity. However, diffraction grating 32 is an aperiodic grating since it comprises no periodically-repeated pattern.

The expressions of pseudo-period P, of local filling factor f(r), and of average refraction index ñ(r) are given hereafter by continuous functions which particularly depend on radius r. However, such function are to be discretely applied at each hole 36 and/or each raised portion 34 of the diffraction grating.

To be able to consider that diffraction grating 32 behaves as a surface layer with local refraction index, pseudo-period P should verify the following relation (1):

$$P < \frac{\lambda}{2} \quad (1)$$

where $\lambda$ is the wavelength of the radiation emitted by active area 18.

Further, the following relations (2), (3), and (4) are verified:

$$\tilde{n}(r) = \tilde{n}(0) - n_i \frac{\left| \sqrt{(F-h)^2 + r^2} - (F-h) \right|}{h} \quad (2)$$

$$\tilde{n}(r) = \sqrt{f(r)n_e^2 + (1-f(r))n_i^2} \qquad (3)$$

$$F = \frac{R\cos((n_e/n_i)\sin\theta_e)}{(n_e/n_i)\sin\theta_e} \qquad (4)$$

In relation (4), half angle of divergence $\theta_e$ is that obtained in the absence of diffraction grating 32.

Distance F may be seen as the distance between front surface 20 and a virtual point source which would provide the same wavefront on front surface 20 as active area 18. Since active area 18 supplies an electromagnetic radiation which is less diverging than a point source, distance F is always greater than the distance between active area 18 and front surface 20.

Filling factor f is between a minimum filing factor fmin and a maximum filling factor fmax. Minimum filling factor fmin is reached at center O of diffraction grating 32 and maximum filling factor fmax is reached at the periphery of diffraction grating 32. Filling factors fmin and fmax are particularly imposed by the methods implemented for the forming of raised portions 34 and of holes 36.

Filling factors fmin and fmax enable to determine depth h. Indeed, they set values ñ(0) and ñ(R) by relation (3). Depth h is then provided by relation (2).

According to an embodiment, depth h may be in the range from 30 nm to 3 μm. The maximum radial dimension R of diffraction grating 32 is preferably in the range from 1 μm to 100 μm.

According to an embodiment, the semiconductor layers of stack 12 are at least partly formed from at least one semiconductor material adapted to the forming of a light-emitting diode, particularly a semiconductor material selected from the group comprising III-V compounds, II-VI compounds, or group-IV semiconductors or compounds.

The semiconductor layers of stack 12 may be at least partly made up of semiconductor materials mainly comprising a III-V compound, for example, a III-N compound. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

The semiconductor layers of stack 12 may be at least partly formed from semiconductor materials mainly comprising a II-VI compound. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions.

The semiconductor layers of stack 12 may be at least partly made up of semiconductor materials mainly comprising at least one group-IV compound. Examples of group-IV semiconductor materials are silicon (Si), carbon (C), germanium (Ge), silicon carbide alloys (SiC), silicon-germanium alloys (SiGe), or germanium carbide alloys (GeC).

The semiconductor layers of stack 12 may comprise a dopant. As an example, for III-V compounds, the dopant may be selected from the group comprising a P-type group-II dopant, for example, magnesium (Mg), zinc (Zn), cadmium (Cd), or mercury (Hg), a P-type group-IV dopant, for example, carbon (C), or an N-type group-IV dopant, for example, silicon (Si), germanium (Ge), selenium (Se), sulfur (S), terbium (Tb), or tin (Sn).

Active area 18 may comprise confinement means. As an example, active area 18 may comprise a single quantum well. It then comprises a semiconductor material different from the semiconductor material forming semiconductor layers 14 and 16 and having a bandgap smaller than that of the material forming semiconductor layers 14 and 16. Active area 18 may comprise multiple quantum wells. It then comprises a stack of semiconductor layers forming an alternation of quantum wells and of barrier layers.

The thickness of semiconductor layer 14 may be in the range from 0.1 μm to 0.3 μm, for example, approximately 0.2 μm. The thickness of active area 18 may be in the range from 5 nm to 300 nm, for example, approximately 200 nm. According to an embodiment, semiconductor layer 16 may be formed by a stack of at least two semiconductor layer, for example having different dopant concentrations. The thickness of semiconductor layer 16 may be in the range from 1 μm to 10 μm.

Each conductive pad 22 may correspond to a conductive layer, for example, metallic, or to a stack of conductive layers, for example, metallic. The material forming each conductive pad 22 is, for example, nickel silicide (NiSi), aluminum (Al), aluminum silicide (AlSi), titanium (Ti), or titanium silicide (TiSi).

Insulating portion 26 may be made of a dielectric material, for example, of silicon oxide ($SiO_2$), of silicon nitride ($Si_xN_y$, where x is approximately equal to 3 and y is approximately equal to 4, for example, $Si_3N_4$), of silicon oxynitride (particularly of general formula $SiO_xN_y$, for example, $Si_2ON_2$), of hafnium oxide ($HfO_2$), or of aluminum oxide ($Al_2O_3$).

Optoelectronic device 30 may comprise a plurality of separate light-emitting diodes, each comprising an active area 18, the device comprising, for each light-emitting diode, a diffraction grating 32 opposite the light-emitting diode.

The diffraction grating 32 shown in FIG. 4 has the advantage that the extraction efficiency does not depend on the polarization of the radiation emitted by active area 18, conversely to the diffraction grating 32 shown in FIG. 5. For a given radiation emitted by active area 18, the proportion of light extracted by diffraction grating 32 shown in FIG. 4 is greater than the proportion of light extracted by the diffraction grating 32 shown in FIG. 4.

Simulations have been performed by time domain finite difference calculation. For the simulations, semiconductor layers 14 and 16 were made of GaN and active area 18 comprised multiple quantum wells comprising an alternation of GaN layers and of AlGaN layers. The wavelength λ of the radiation emitted by active area 18 was 405 nm. The thickness of the active area measured in a plane perpendicular to direction Z was 2 μm.

A first simulation has been carried out with the structure of optoelectronic device 10 shown in FIG. 1. A half angle of divergence $\theta_e$ equal to 13.50 has been obtained. Further, the reflection of the light emitted by active area 18 at the level of front surface 20 was 19%.

A second simulation has been carried out with the structure of the optoelectronic device 30 shown in FIGS. 2 and 3. A third simulation has been carried out with the structure of the optoelectronic 30 shown in FIGS. 2 and 4. For the second and third simulations, radius R of diffraction grating 32 was 1.2 µm. Relation (4) gave distance F equal to 12.8 µm.

For the second and third simulations, a pseudo-period P equal to 150 nm has been considered, which satisfies relation (1). It has been considered that the method of manufacturing holes 36 and raised portions 34 imposes a critical 50-nm dimension, corresponding to the smallest pattern which can be formed. This has imposed the extreme filling factors, that is, a factor fin equal to ⅓ and a factor fmax equal to ⅔. Based on relation (3), an index ñ(0) equal to 2.11 and an index ñ(R) equal to 1.65 have been obtained. Relation (2) has provided a depth h equal to 0.3 µm. Further, relation (2) has given the variation of local index ñ and, based on relation (3), the dimensions of 9 holes have been obtained (1 central square hole and 8 successive square holes in a radial direction away from the central square hole in the case of a diffraction grating 32 having the structure shown in FIG. 3 or one central groove and 8 concentric grooves in the case of a diffraction grating 32 having the structure shown in FIG. 4). The values of the local index for the 9 holes are 2.11/2.1028/2.0814/2.0457/1.9956/1.9314/1.8529/1.7602/ 1.6534 and the values of f for the 9 holes are 0.333/0.3482/ 0.3653/0.3934/0.4319/0.48/0.5365/0.6003/0.6698. The radial dimensions of holes 36 are equal to product P* f and are, for the 8 holes, 50 nm/52.2 nm/54.8 nm/59 nm/64.8 nm/72 nm/80.5 nm/90 nm/100 nm. The second and third simulations have shown that half angle of divergence $\theta_e$ was equal to 8°. A decrease in half angle of divergence $\theta_e$ has thus been obtained. Further, for the second and third simulations, the reflection of the light emitted by active area 18 at the level of front surface 20 was 11%. A reflection decrease has thus been obtained. This causes a decrease in the excitation of the guided modes, by in the order of a factor 2, and thus an increase in the extraction efficiency of optoelectronic device 30 with respect to optoelectronic device 10 by in the order of 50%.

FIGS. 5A to 5I are partial simplified cross-section views of the structures obtained a successive steps of an embodiment of a method of simultaneously manufacturing a plurality of copies of the optoelectronic device 30 shown in FIG. 2, each optoelectronic device 30 for example corresponding to a display pixel of a display device.

Figure 5A:
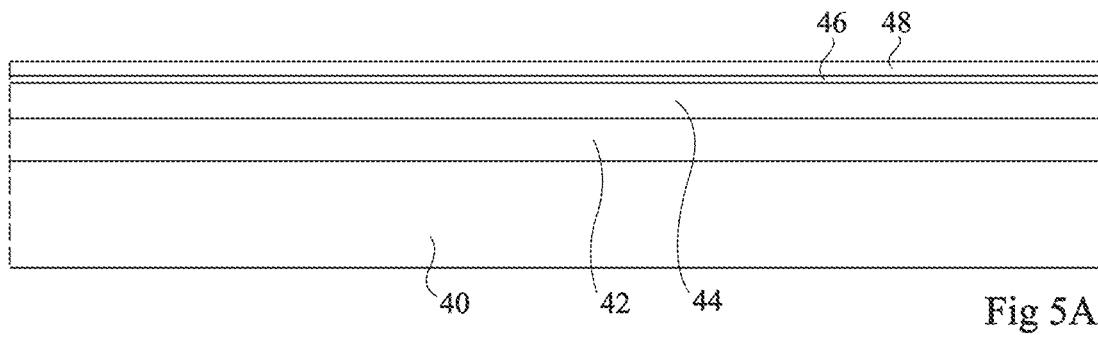
FIGS. 5A to 5I are partial simplified cross-section views of the structures obtained at successive steps of another embodiment of a method of manufacturing an optoelectronic device of the type shown in FIG. 2.

The method comprises the successive steps of:

(1) Forming, for example by epitaxy, on a substrate 40, a stack of semiconductor layers successively comprising an intermediate layer 42, a doped layer 44 of a first conductivity type, for example, type N, an active layer 46, and a doped layer 48 of a second conductivity type, for example, type P, opposite to the first conductivity type (FIG. 5A). Substrate 40 may correspond to a monoblock structure or to a layer covering a support made of another material. Substrate 40 may be a semiconductor substrate, for example, a substrate made of silicon, of germanium, of silicon carbide, of a III-V compound such as GaN or GaAs, or a ZnO substrate. Substrate 40 may correspond to a multilayer structure of silicon-on-insulator type, also called SOI. Substrate 40 may be made of an electrically-insulating material, for example, of sapphire.

Figure 5B:
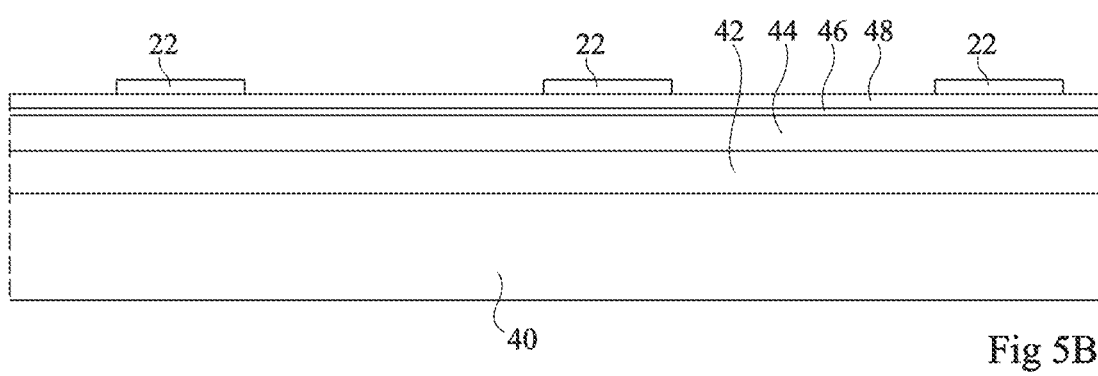

(2) Depositing a metal layer on layer 48 and etching the metal layer to delimit conductive pad 22 for each optoelectronic device (FIG. 5B).

Figure 5C:
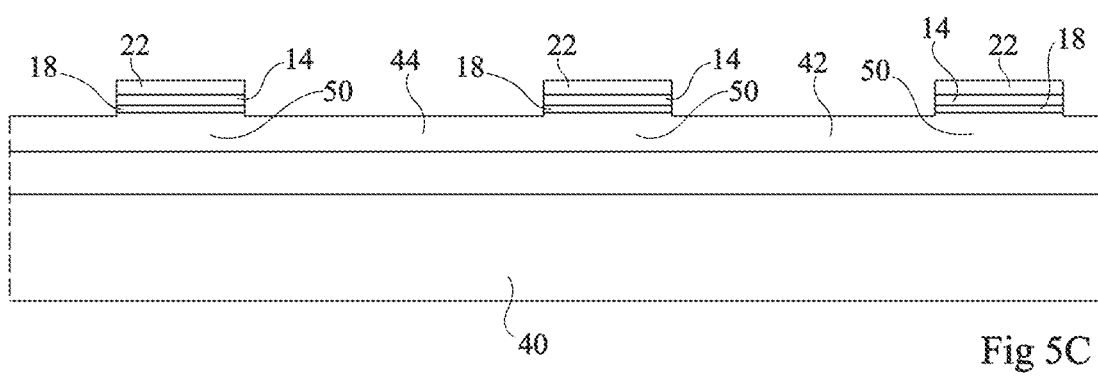

(3) Etching layer 48, active layer 46, and a portion of the thickness of layer 44, the etching stopping in layer 44 to delimit, for each optoelectronic device, semiconductor layer 14, active area 18, and a semiconductor portion 50 (FIG. 5C). Pads 22 play the role of a mask during the etch operation.

Figure 5D:
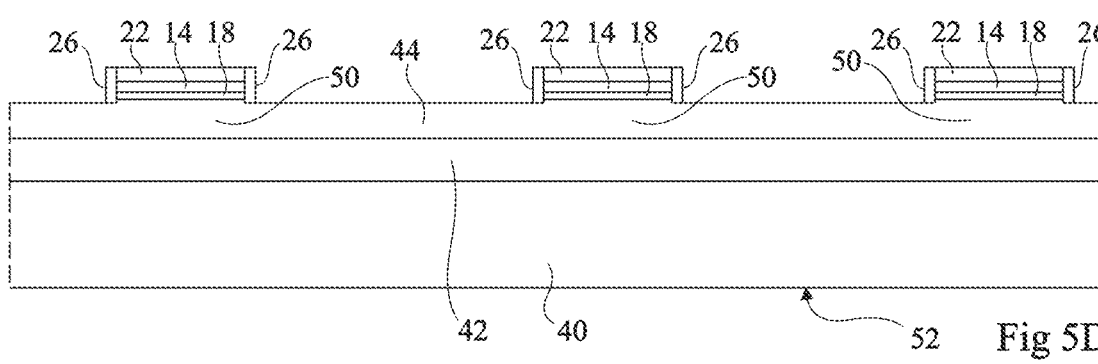

(4) Depositing an electrically-insulating layer over the entire structure and anisotropically etching the electrically-insulating layer to delimit insulating portion 26 for each optoelectronic device (FIG. 5D).

Figure 5E:
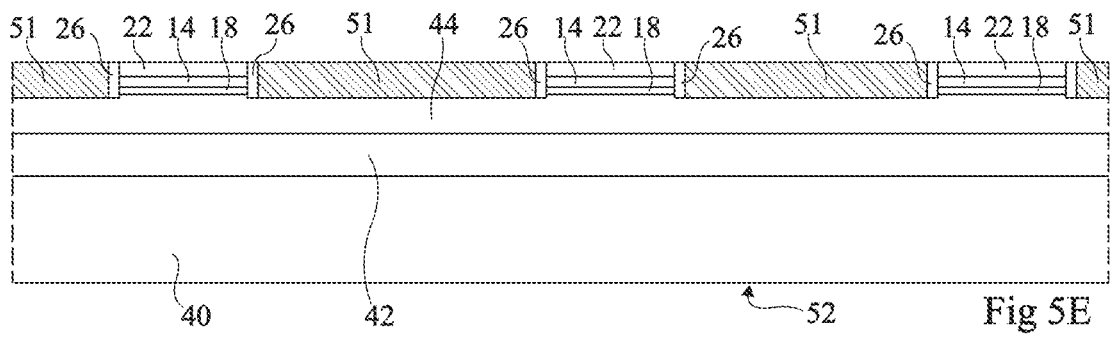

(5) Depositing a metal layer over the entire structure and etching the metal layer, for example, by chem.-mech. planarization to delimit conductive pad 51 for each optoelectronic device in contact with semiconductor layer 44 (FIG. 5E). An optoelectronic device 52 is thus obtained.

Figure 5F:
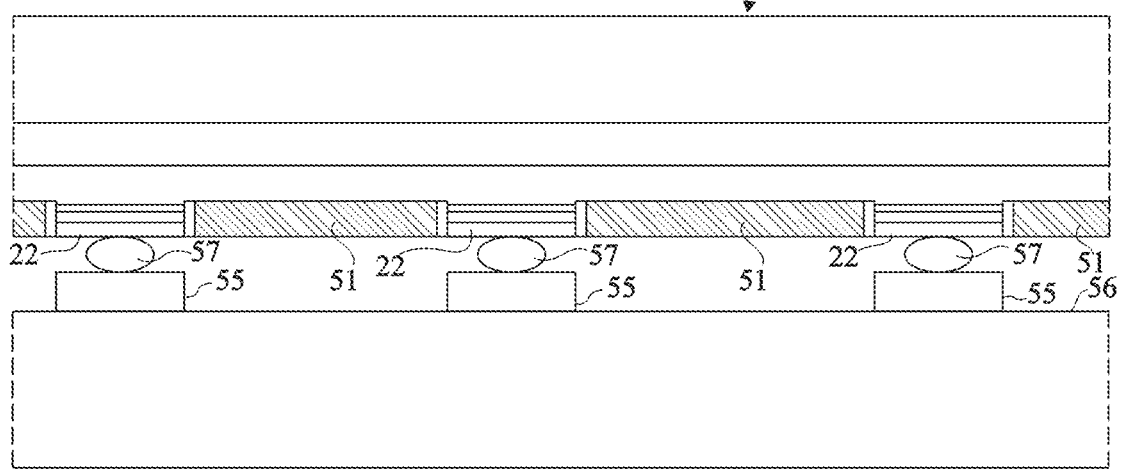

(6) Affixing optoelectronic 52 to an electronic circuit 54 (FIG. 5F). Electronic circuit 54 comprises electronic components, not shown. In FIG. 5F, only conductive pads 55 have been shown on a surface 56 of electronic circuit 54. Conductive pads 55 are electrically connected to conductive pads 22 and/or 51. According to the spacing between conductive pads 55, the connection between optoelectronic device 52 and electronic circuit 54 may be formed via conductive balls 57 or microtubes.

Figure 5G:
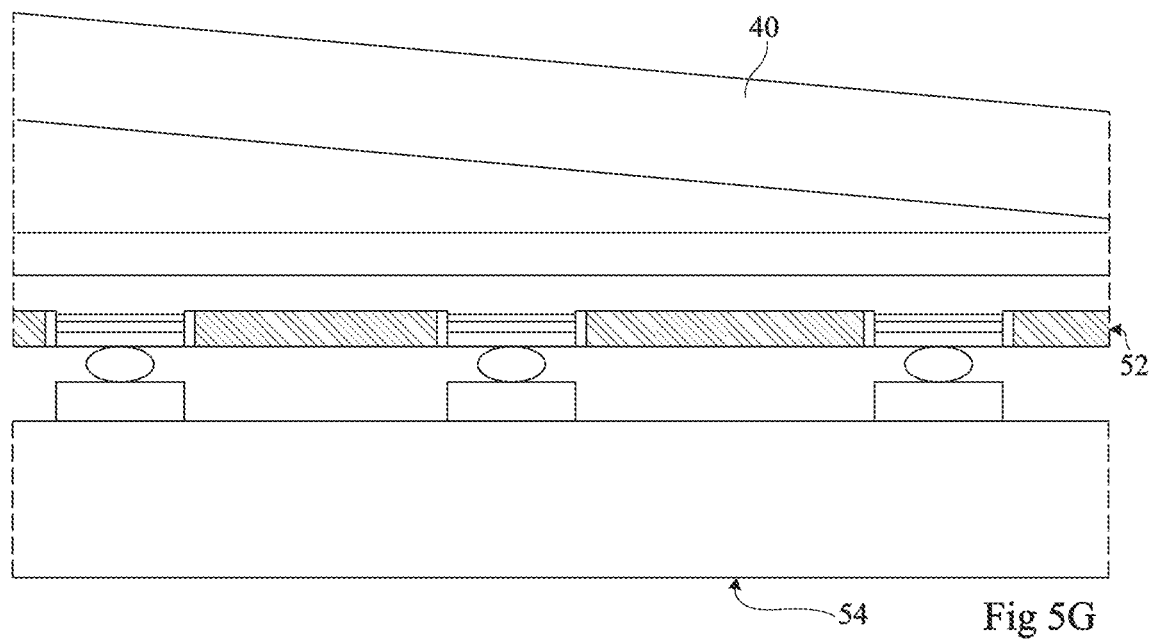

(7) Removing substrate 40, for example, by a lift-off method (FIG. 5G).

Figure 5H:
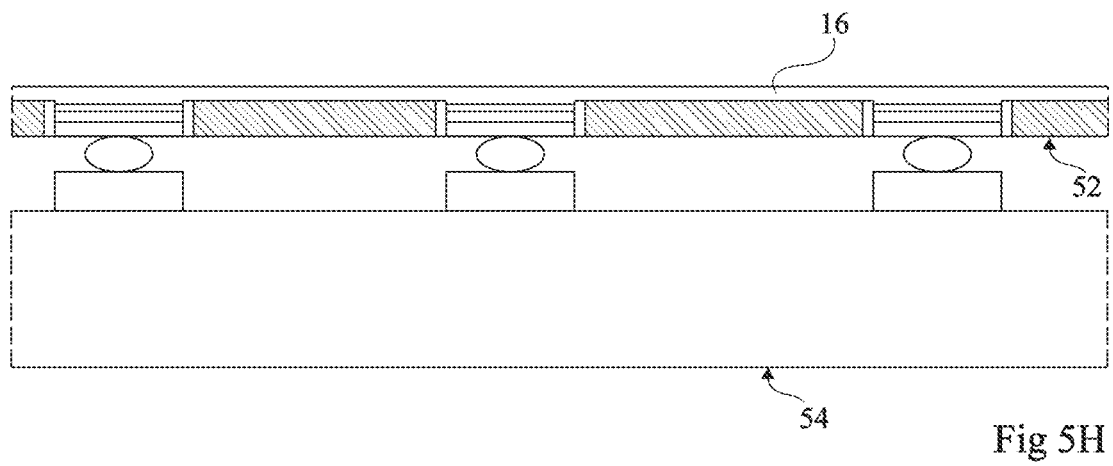

(8) Etching the entire intermediate layer 42 and etching semiconductor portion 42, only across a portion of the thickness of semiconductor portion 42, to delimit semiconductor layer 16 for each optoelectronic device (FIG. 5H).

Figure 5I:
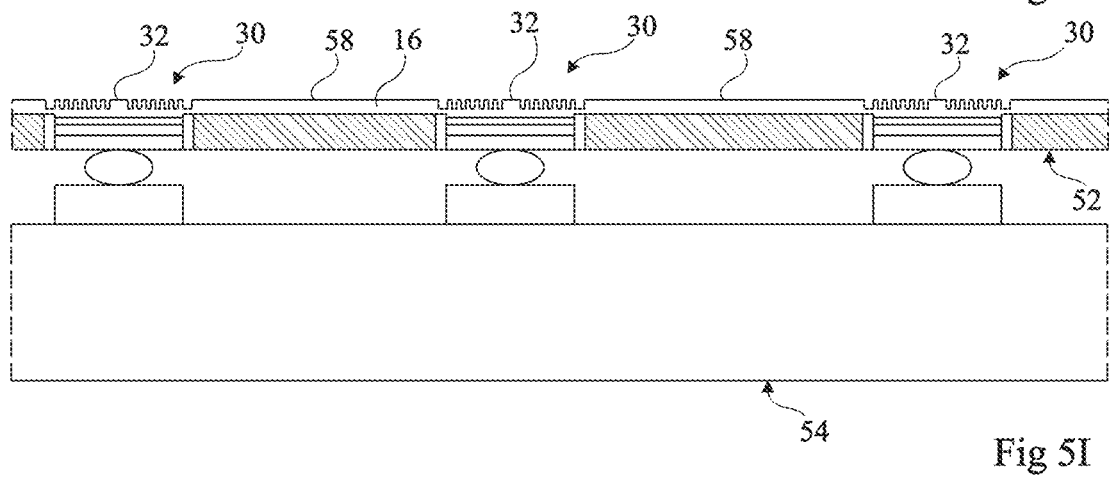

(9) Forming diffraction grating 32 for each optoelectronic device by etching patterns in semiconductor layer 16 (FIG. 5I). An optoelectronic device 52 comprising a plurality of optoelectronic devices 30 is obtained. A non-structured area 58 of semiconductor layer 16 may be left between two adjacent optoelectronic devices 30.

The method may further comprise a step of depositing a transparent layer covering semiconductor layer 16.

FIGS. 6A to 6J are partial simplified cross-section views of the structures obtained at successive steps of another embodiment of a method of simultaneously manufacturing a plurality of copies of optoelectronic device 30 shown in FIG. 2, each optoelectronic device 30 for example corresponding to a display pixel of a display device.

Figure 6A:
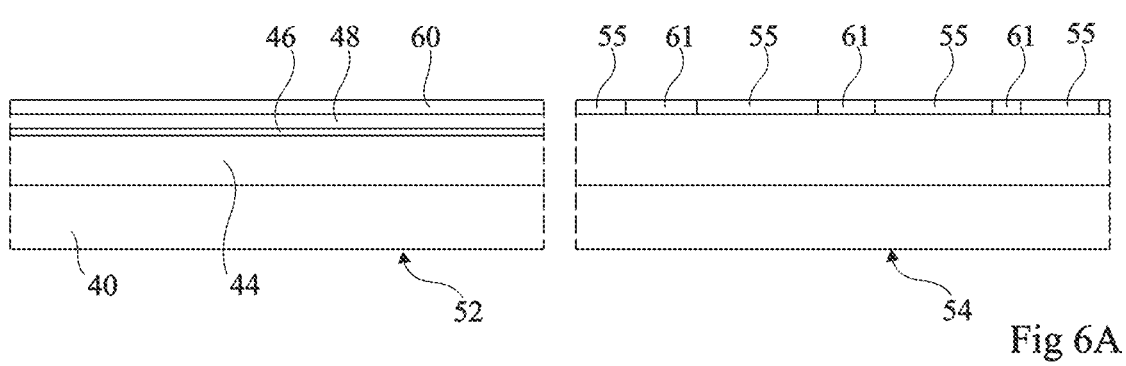
FIGS. 6A to 6J are partial simplified cross-section views of the structures obtained at successive steps of another embodiment of a method of manufacturing an optoelectronic device of the type shown in FIG. 2.

The method comprises the successive steps of:

(1)' Manufacturing the same structure as that shown in FIG. 5A, with the difference that semiconductor layer 42 is not shown and that a metal layer 60 covers layer 48, and separately manufacturing electronic circuit 54, conductive pads 55 being shown as being separated by electrically-insulated regions 61 (FIG. 6A).

Figure 6B:
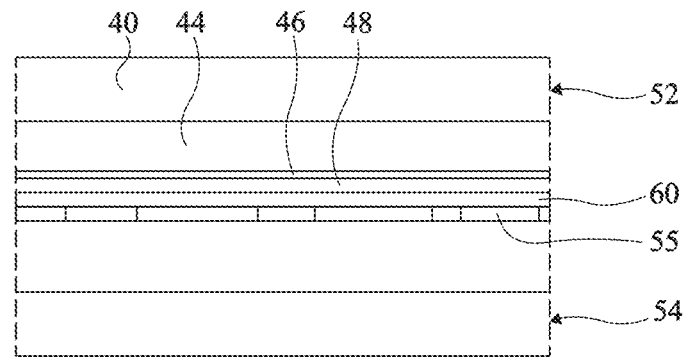

(2)' Affixing optoelectronic device 52 to electronic circuit 54, for example, by gluing (FIG. 6B). Conductive pads 55 are electrically connected to metal layer 60.

Figure 6C:
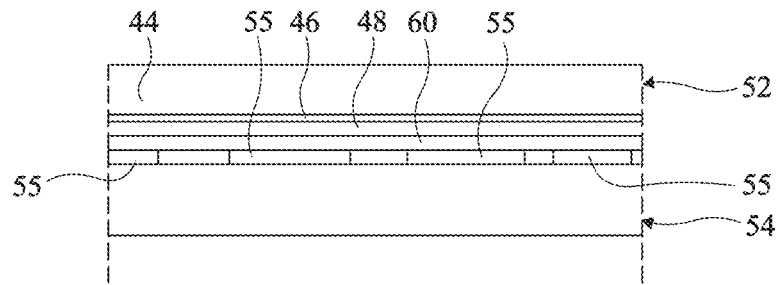

(3)' Removing substrate 40 (FIG. 6C).

Figure 6D:
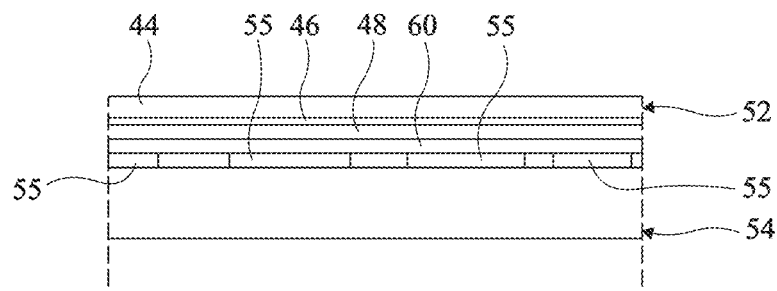
Figure 6E:
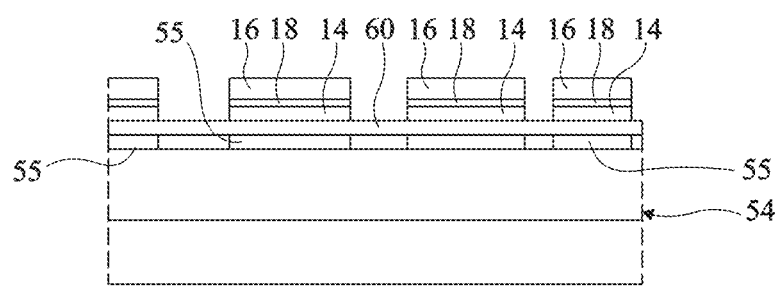

(4)' Etching semiconductor layer 44 across a portion of its thickness (FIG. 6D).

Figure 6F:
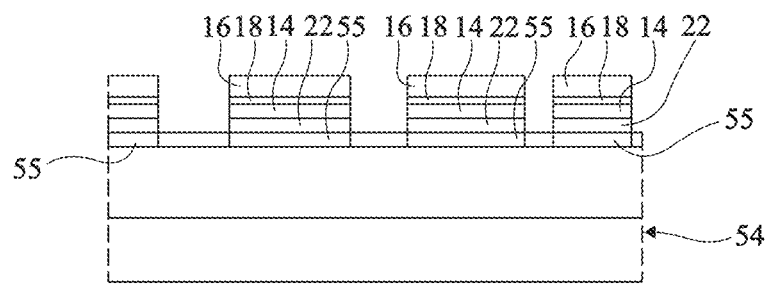

(5)' Separating the light-emitting diodes, for example, by the successive etching of semiconductor layers 44, 46, and 48 to delimit, for each optoelectronic, semiconductor layer 16, active area 18, and semiconductor layer 14 (FIG. 6E), and by the etching of metal layer 60 to delimit conductive pad 22 for each optoelectronic (FIG. 6F).

Figure 6G:
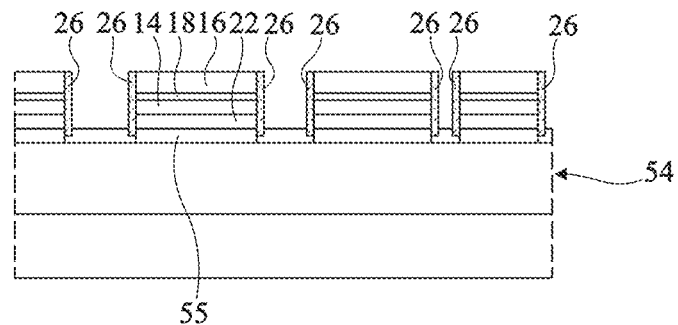

(6)' Depositing an electrically-insulating layer over the entire structure and anisotropically etching the electrically-insulating layer to delimit insulating portions 26 on the sides of each optoelectronic device (FIG. 6G).

Figure 6H:
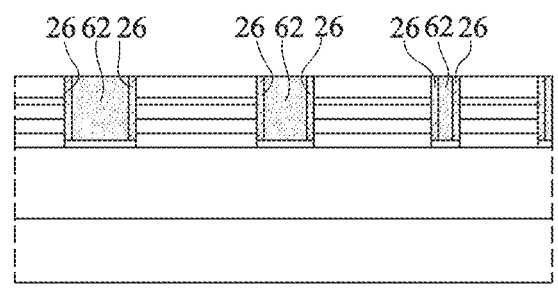

(7)' Depositing a filling material 62 between the insulating portions 26 of adjacent optoelectronic devices (FIG. 6H). Filling material 62 may be one of the materials previously indicated for insulating portion 26. A chemical mechanical planarization is then performed to obtain wells of filling material 62.

Figure 6I:
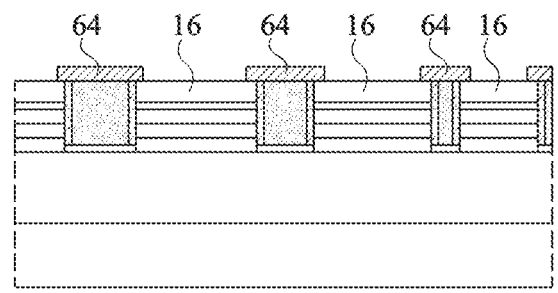

(8)' Depositing a metal layer on the structure obtained at the previous step to delimit conductive portions 64 in contact with the semiconductor layer 16 of each optoelectronic device (FIG. 6I).

Figure 6J:
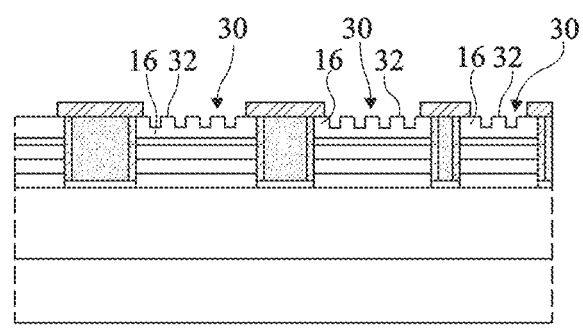

(9)' Forming the diffraction grating 32 of each optoelectronic device 30 by partial etching of semiconductor layer 16 (FIG. 6J).

Specific embodiments have been described. Various alterations, modifications, and improvements will readily occur to those skilled in the art.

The invention claimed is:

1. An optoelectronic device comprising an active area capable of supplying an electromagnetic radiation and sandwiched between first and second semiconductor layers, the first semiconductor layer delimiting a surface, the optoelectronic device further comprising a diffraction grating capable of extracting the electromagnetic radiation from the first semiconductor layer, the diffraction grating comprising a plurality of holes extending in the first semiconductor layer from said surface toward the second semiconductor layer, a respective width of each hole in the plurality of holes, measured in a cross section and in a plane parallel to and disposed at said surface, increasing from a central portion of the diffraction grating to a peripheral portion of the diffraction grating, the plurality of holes being arranged in rows and in columns.

2. The optoelectronic of claim 1, wherein the plurality of holes have a circular, ellipsoidal, or polygonal cross-section.

3. The optoelectronic device of claim 1, wherein a thickness of the first semiconductor layer is in the range from 1 pm to 10 pm.

4. The optoelectronic device of claim 1, wherein the depth of each hole in the plurality of holes is in the range from 30 nm to 3 pm.

5. The optoelectronic of claim 1, wherein the first and second semiconductor layers are at least partly formed from at least a semiconductor material selected from the group comprising III-V compounds, II-VI compounds, or group-IV semiconductors or compounds.

6. The optoelectronic of claim 1, wherein a distance between the central points of two adjacent holes along a radial direction of the diffraction grating is shorter than half the wavelength of the electromagnetic radiation.

7. A method of manufacturing an optoelectronic device comprising an active area capable of supplying an electromagnetic radiation sandwiched between first and second semiconductor layers, the first semiconductor layer delimiting a surface, the method comprising forming a diffraction grating capable of extracting the electromagnetic radiation from the first semiconductor layer, the diffraction grating comprising a plurality of holes extending in the first semiconductor layer from said surface toward the second semiconductor layer, a respective width of each hole in the plurality of holes, measured in a cross section and in a plane parallel to and disposed at said surface increasing from a central portion of the diffraction grating to a peripheral portion of the diffraction grating, the plurality of holes being arranged in rows and in columns.

8. The method of claim 7, comprising a step of determining depth h of each hole of the plurality of holes and of determining, for each hole, a filling factor f equal to the ratio of the width, measured radially from a center of the diffraction grating, of said hole, to the distance, measured radially, between the central points of two adjacent holes along a radial direction of the diffraction grating, filling factor f and height h being determined according to the following relations:

$$\tilde{n}(r) = \tilde{n}(0) - n_i \frac{\left|\sqrt{(F-h)^2 + r^2} - (F-h)\right|}{h}$$

$$\tilde{n}(r) = \sqrt{f(r)n_e^2 + (1-f(r))n_i^2}$$

$$F = \frac{R\cos((n_e/n_i)\sin\theta_e)}{(n_e/n_i)\sin\theta_e}$$

where r is the distance between the central point of the hole and the center, R is the radius, measured from the center, of the circumscribed circle of the diffraction grating, $n_i$ is the refraction index of the first semiconductor layer at the wavelength of the electromagnetic radiation, $n_e$ is the refraction index of the medium in contact with the first semiconductor layer at the wavelength of the electromagnetic radiation, $\Theta_e$ is the half angle of divergence of the beam emitted by the optoelectronic in the absence of the diffraction grating, and ñ(r) is the average refraction index at distance r which enables, in the absence of the diffraction grating, to obtain the same deviation of a ray extracted out of the first semiconductor layer as that obtained in the presence of the diffraction grating.

\* \* \* \* \*

UNITED STATES PATENT AND TRADEMARK OFFICE
CERTIFICATE OF CORRECTION

PATENT NO. : 11,127,884 B2
APPLICATION NO. : 16/465711
DATED : September 21, 2021
INVENTOR(S) : François Templier et al.

Page 1 of 1

It is certified that error appears in the above-identified patent and that said Letters Patent is hereby corrected as shown below:

In the Claims

Column 11, Claim 3, Line 34, DELETE "from 1 pm to 10 pm" INSERT --from 1 µm to 10 µm.--

Column 11, Claim 4, Line 37, DELETE "to 3 pm" INSERT --to 3 µm.--

Signed and Sealed this
Thirtieth Day of November, 2021

Drew Hirshfeld
*Performing the Functions and Duties of the*
*Under Secretary of Commerce for Intellectual Property and*
*Director of the United States Patent and Trademark Office*